United States Patent [19]

Roberts et al.

[11] Patent Number: 4,601,382
[45] Date of Patent: Jul. 22, 1986

[54] PICK-STATION AND FEED APPARATUS IN PICK-AND-PLACE MACHINE

[75] Inventors: William E. Roberts, Rolling Hills Estates; Alfred M. Nelson, Redondo Beach, both of Calif.

[73] Assignee: Excellon Industries, Torrance, Calif.

[21] Appl. No.: 575,559

[22] Filed: Jan. 31, 1984

[51] Int. Cl.⁴ .............................................. B65G 47/26
[52] U.S. Cl. ................................ 198/432; 198/463.5; 198/690.1; 198/755; 221/212
[58] Field of Search ................ 414/131; 198/432, 474, 198/755, 690, 433, 421, 381, 619, 446, 463.5, 690.1; 221/212; 209/904, 907, 539; 193/32, 40; 271/226, 229, 193

[56] References Cited

U.S. PATENT DOCUMENTS

| | | | |
|---|---|---|---|
| 2,334,004 | 11/1943 | Herzog | 29/604 |
| 2,822,953 | 2/1958 | Kunath | 198/421 X |
| 3,079,140 | 2/1963 | Sorchy | 269/8 |
| 3,195,773 | 7/1965 | Hopkins | 221/212 |
| 3,662,302 | 5/1972 | Ioffe et al. | 198/381 X |
| 4,259,922 | 4/1981 | Dieme | 269/8 |

FOREIGN PATENT DOCUMENTS

| | | | |
|---|---|---|---|
| 57-9637 | 1/1982 | Japan | 414/131 |
| 57-51611 | 3/1982 | Japan | 198/446 |

Primary Examiner—Robert J. Spar
Assistant Examiner—Jonathan D. Holmes
Attorney, Agent, or Firm—Gausewitz, Carr & Rothenberg

[57] ABSTRACT

A pick-and-place machine having magnetic elements which hold down the chips at the pick stations, thus preventing shingling, and also hold such chips at the pick stations adjacent a stop element. The magnetic elements create magnetic forces in two directions relative to chip elements having magnetizable terminal portions. The magnetic elements are provided in combination with feed apparatus that is adapted to stop, when the associated groove is full of chips, rather than causing the machine to jam.

8 Claims, 7 Drawing Figures

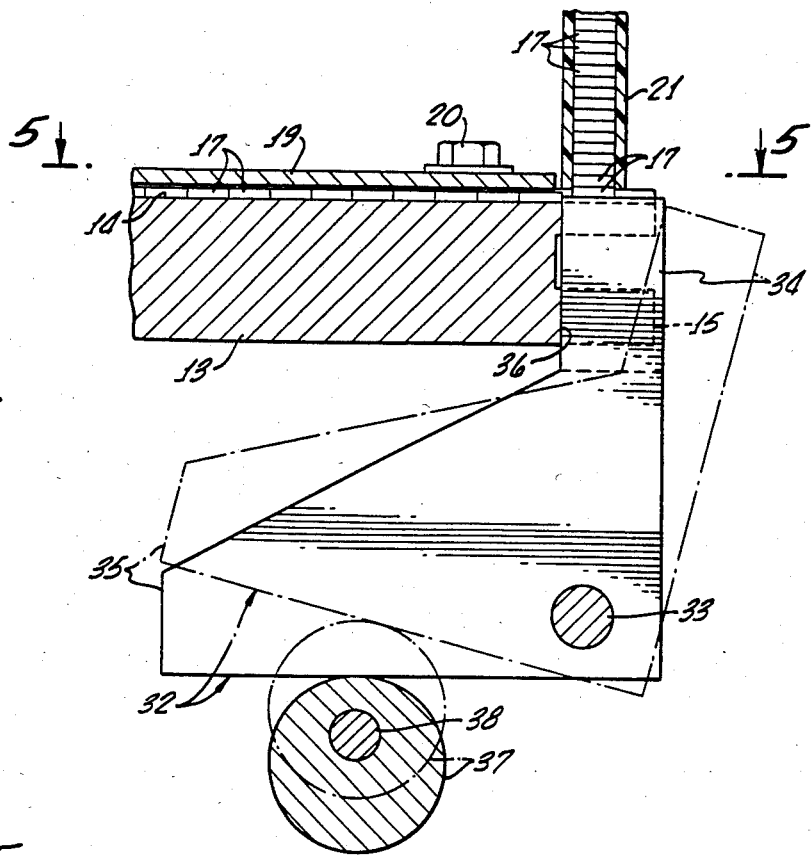
FIG. 4.
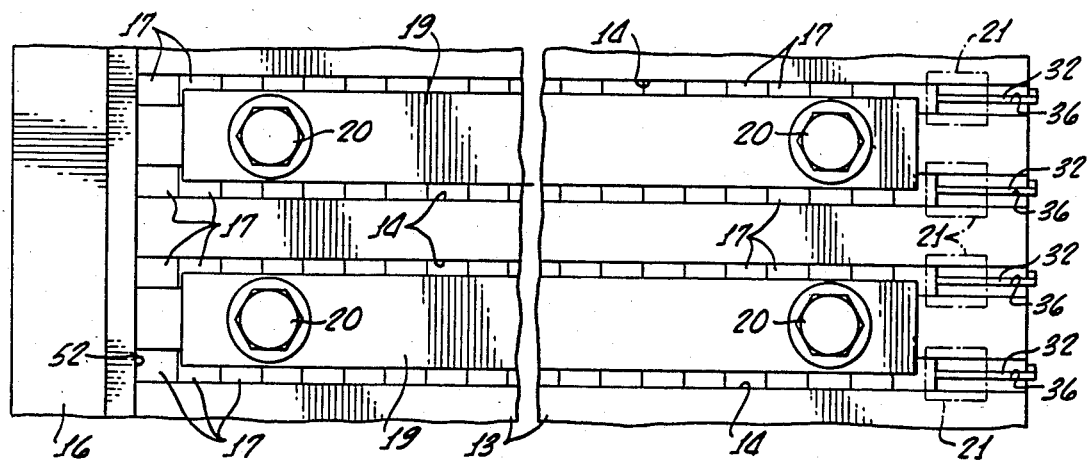
FIG. 5.
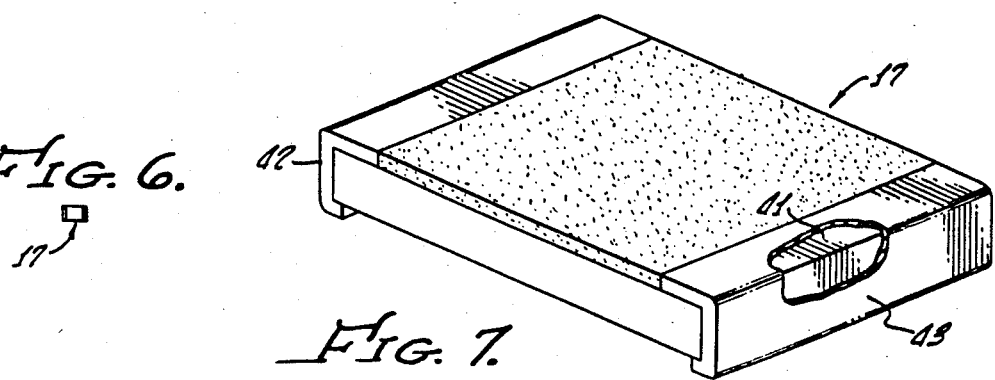
FIG. 6.
FIG. 7.

PICK-STATION AND FEED APPARATUS IN PICK-AND-PLACE MACHINE

BACKGROUND OF THE INVENTION

In pick-and-place machines, it is conventional to provide a number of magazines of a variety of very small, thin, chips, such as resistors and capacitors, which present the chips at pick stations from which they are removed and then incorporated in the electronic circuit being constructed by the machine. It has been common practice to provide rather complex and expensive arrangements for feeding the chips to the pick stations and locating the chips at such stations. One such arrangement involves positioning a magazine beneath each pick station, each magazine having its own logic and driving circuit in an attempt to assure that a part is always presented at the top of the magazine. The resulting construction is undesirably complicated and expensive, and may lack reliability and ruggedness.

A highly desirable method of feeding chips to pick stations is by means of a vibrating table, there being rows of chips disposed in parallel grooves in the table. Vibratory feeding of the chips toward the pick stations is thus effected until a stop bar is reached, but it is at the stop bar that critical problems arise. It is emphasized that the chips are very small, and usually are not perfectly rectangular. When such chips are vibrated toward a stop bar that is fixed in space, and when a chip is against a stop bar, the one pushing behind it tends to slide underneath to create a "shingling" effect, or to tilt up the first chip at a 90-degree angle. Reliability and pick accuracy are thus substantially degraded. The tendency to shingle is exacerbated because the stop bar is fixed in space, hence the chip against the bar is not moving. However, the other chips in the component feed tray are vibrating against the fixed chips and tend to slide underneath.

When the stop bar is not fixed in space, but is instead mounted on the vibrating table, the tendency toward shingling is somewhat reduced. However, other problems are not diminished, one being that when only one chip is in the pick station, it tends to vibrate against the stop bar and then bounce away from it, again degrading the accuracy of the pick position.

The tendency toward shingling is increased, even when the stop bar is mounted on the vibrating table, when certain magazine and actuator arrangements are employed which cause cessation of chip loading into the grooves when the grooves are full. The full grooves, in combination with the actuator means to unload the magazines, create low forces—additional to the vibratory forces—which push the rows of chips against the foremost chip and tend toward shingling.

BRIEF SUMMARY OF THE INVENTION

Preferably, the stop bar in the present invention is mounted on the vibratory table. Furthermore, the feed grooves through which the chips vibrate are loaded by means of unjammable elements which generate small forces directed toward the stop bar, and which augment the vibratory forces. Despite the presence of both vibratory forces and these augmenting forces (the latter being present only when the grooves are full), the present invention substantially eliminates shingling. Furthermore, the present invention causes the chips to remain closely adjacent the stop bar, so that both the reliability and accuracy of the pick are highly satisfactory.

The chips have nickel coatings as parts of the end conductor configurations, and such coatings are magnetizable to a certain extent. In accordance with one major aspect of the present invention, magnetic means are provided to act upon such nickel coatings in ways which achieve both the desired positioning and the prevention of shingling.

In the preferred embodiment, a magnetic circuit is provided at each pick station, and is so constructed that the chip at the pick station is constrained in position so that it does not move even when there is only a single chip in the groove, namely, such chip at the pick station. Furthermore, the back end of the foremost chip is held down so that it does not shingle even when there is a full track of chips in the groove.

There is a desired range of magnetic forces, since there must be sufficient magnetic flux but not an excessive amount. If too much magnetic energy is provided, the chip will stop at the first pole, and the vibration from the component feed tray will not be sufficient to move the chip forward until the stop bar is engaged. On the other hand, an insufficient amount of magnetic field reduces excessively the shingling-controlling function of the magnetic circuit.

BRIEF DESCRIPTION OF THE DRAWINGS

FIG. 4 is an enlarged fragmentary vertical sectional view of the chip feed mechanism which loads the grooves in the vibrating tables;

FIG. 5 is a fragmentary horizontal section on line 5—5 of FIG. 4, and also showing the outer ends of feed grooves and showing the adjacent stop bar;

FIG. 6 is a slightly enlarged plan view of one of the various types of chips that may be fed and located by the present machine; and, FIG. 7 is a greatly enlarged isometric view thereof.

DETAILED DESCRIPTION OF THE PREFERRED EMBODIMENT OF THE INVENTION

Figure 1:
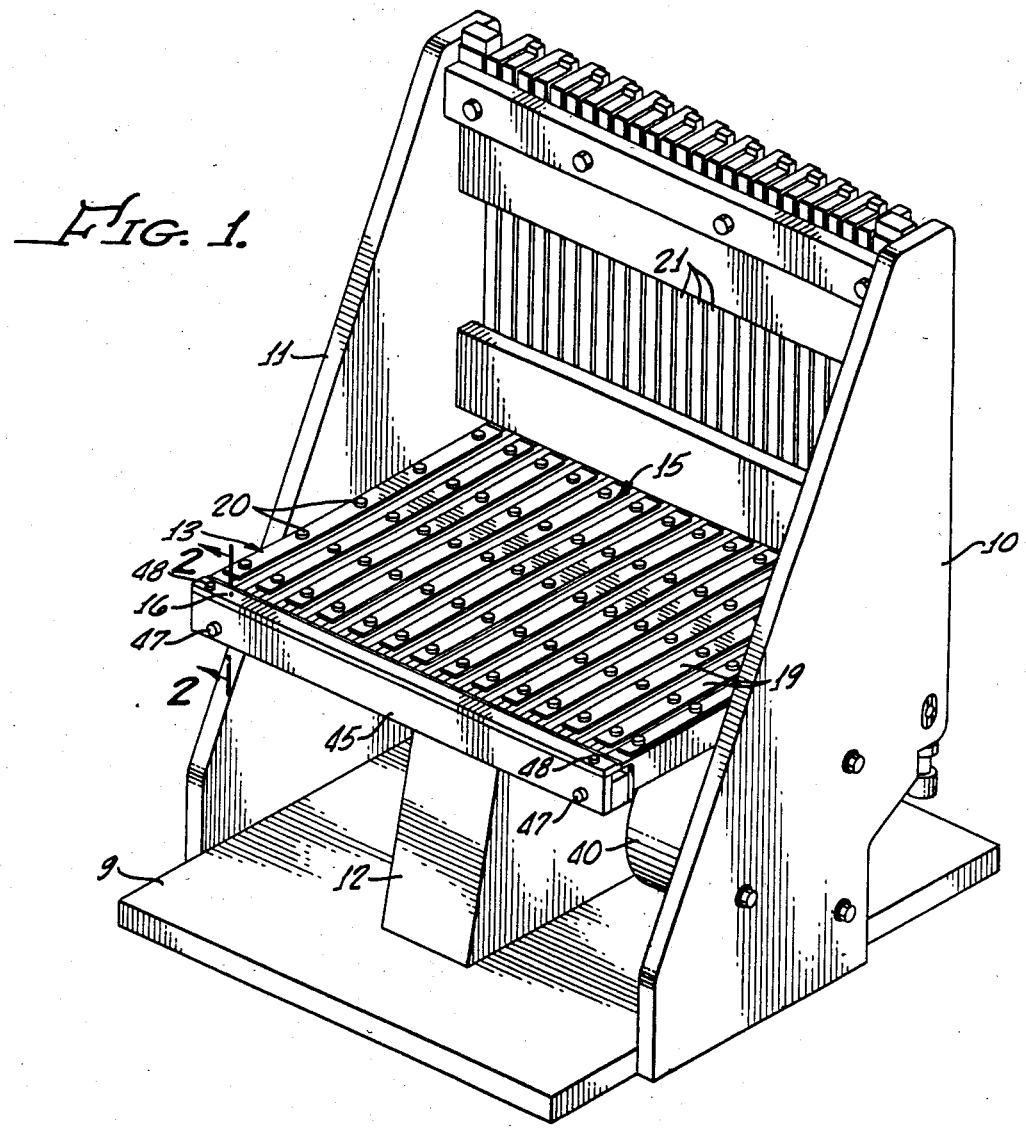
FIG. 1 is an isometric view of pick-and-place apparatus incorporating the present invention.

The chip feeding and locating portion of the pick-and-place machine includes, as illustrated in FIG. 1, a base 9 with vertical gusset plates 10 and 11 at the opposite side edges. A vibrator 12, mounted on the base 9, supports a horizontal table 13 between the gusset plates and above the base 9. The table 13 is not attached to the gussets 10 and 11, its side edges being spaced from the gusset plates, so that the table can be vibrated during operation of the machine.

Figure 3:
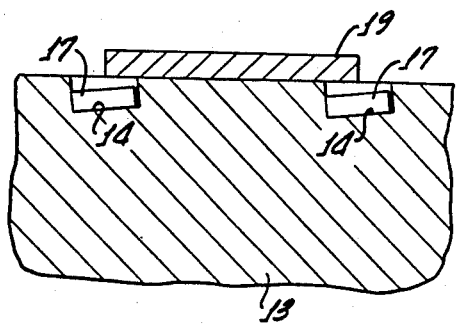
FIG. 3 is a transverse fragmentary sectional view taken on line 3—3 of FIG. 2.

Shallow parallel grooves 14, having straight parallel side walls and flat bottom walls, extend from the rear end 15 of table 13 to a stop 16 at the forward end of the table. These grooves receive chips 17, such as resistors or capacitors to be assembled in an electronic circuit, guiding them in end-to-end relationship. Thus, the grooves 14 are slightly deeper than the thickness of the chips, as well as being sufficiently wide to allow the chips to pass freely through the grooves while at the same time being accurately guided. The bottom walls of the grooves are inclined laterally, as shown in FIG. 3, to maintain the chips against one groove sidewall and help them to be guided along a straight path without rotation. Strips 19, held by screws 20, are secured to the upper surface of table 13 to provide covers for grooves 14. Each strip 19 fits between two grooves, overlapping about half of two adjacent grooves along its side edges (see FIG. 3). This provides visibility, as well as access to the various grooves by removal of the individual cover strips 19, without the necessity of uncovering all of them.

In the operation of the machine, the chips 17 are introduced into grooves 14 adjacent the rear 15 of table 13, and are moved through the grooves to the stop 16 by the vibration of the table. The cover strips 19 do not extend to the stop 16, so the chips 17 adjacent the stop are exposed. There are, therefore, pick stations adjacent stop 16, at which a mechanism, for example a vacuum chuck represented at 22 in FIG. 2, picks up the chips from the pick stations and positions them in the circuit being produced at another location on the overall machine, not shown. It is emphasized that the more accurate the location of the chips 17 at the pick stations, the more accurate will be the location of such chips when placed on the circuit board.

Positioned between gusset plates 10 and 11 are vertical magazines 21, equal in number to the grooves 14. Each magazine is a square or rectangular tube adapted to receive a quantity of chips 17 superimposed one on top of the other. Each magazine has an open bottom end which provides an exit at the one of the grooves 14 with which it is aligned. The magazine 21 communicate with grooves 14 just beyond the rearward ends of cover strips 19. As a result, the chips 17 can drop down from magazines 21 into grooves 14, reference being made to FIG. 4, but under control of an actuating mechanism next described.

The movement of the chips 17 into grooves 14 is controlled by drive members 32 shown in FIG. 4. These are flat plates formed as bell cranks, freely pivotal about a transverse shaft 33 that extends between support gussets 10 and 11. The drive members 32 include relatively thin upper arms 34 that are generally vertically oriented, and thicker generally horizontal arms 35 that project forwardly from shaft 33. A slot 36 extends into the rear 15 of table 13 to receive the upper arm 34 of each of the drive members 32. This provides the guides for the drive members, which otherwise could shift positions along shaft 33. Slots 36 locate the upper arms 34 of the drive members, in alignment with the longitudinal axes of grooves 14, and permit the drive members to rotate to positions such that upper arms 34 are directly beneath the respective magazines 21.

Drive members 32 are pivoted about shaft 33, in one direction, by a cam 37 (FIG. 4) extending transversely of the machine. The cam, which is shown as being cylindrical, is rotated by a shaft 38 that is eccentric with respect to the surface of the cam. Shaft 38 is driven by a motor 40 (FIG. 1) through suitable pulley and belt means (not shown).

When a cam 37 and the associated drive arm 32 are in the solid-line position shown in FIG. 4, the extreme upper edge of arm portion 34 is horizontal and is spaced slightly above the bottom wall of the associated groove 14. Therefore, the lowermost chip 17 in magazine 21 is held above the bottom surface of the groove, and the arm 32 supports the entire content of the chips 17 in the magazine, preventing them from dropping downwardly. Rotation of cam 37 through an angle of 180 degrees, to the position shown in phantom in FIG. 4, causes drive arm 32 to pivot clockwise to the position shown in phantom lines. The upper end edge of the arm portion 34 is thus moved away from the associated magazine, which allows the column of chips 17 to drop downwardly so that the lowermost chip is entirely within a groove 14 in table 13, resting upon the bottom groove surface. Continued rotation of cam 37, back to the solid-line position, causes arm 32 to rotate by the force of gravity back to the solid-line position. This occurs because forward portion 35 of the arm is so positioned and sufficiently heavy to effect this gravity action.

The drive mechanism associated with each of the magazines 17 is thus substantially jam-proof, and operates to create a controlled, predetermined, low force on the lowermost chip 17, to thus push it into the groove 14 (and away from the stack of chips in the magazine) where it can move through groove 14 in response to vibration of table 13.

When the groove 14 is entirely full of chips 17, the rotational movement of arm 32 is arrested by the chip below magazine 21, but the machine does not jam and no damage occurs. There is, however, a relatively low gravitational force pushing against the track of chips 17 in the associated groove 14, and this low force augments the force created by vibration.

For a more detailed description of the magazine and drive apparatus for the chips 17, reference is made to patent application Ser. No. 526,539, filed Aug. 25, 1983, now U.S. Pat. No. 4,564,326, for Feed Arrangement For Pick-And-Place Machine, Inventors William E. Roberts and Milo Cripps, such application being assigned to the same assignee as is the present application. Said application is hereby incorporated by reference herein, as though set forth in full.

DESCRIPTION OF THE MAGNET AND STOP MEANS AT THE PICK STATIONS

Figure 2:
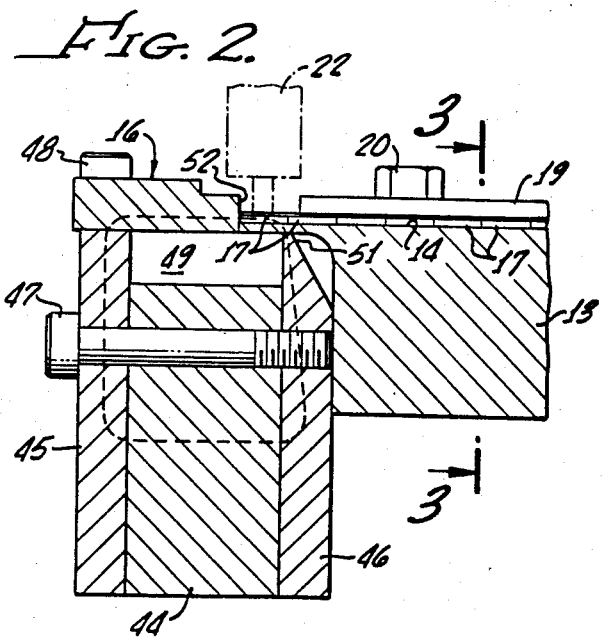
FIG. 2 is an enlarged fragmentary cross-sectional view taken, for example, at the section line 2—2 of FIG. 1.

As described at the beginning of this specification, it is very important that the chips do not tilt up or shingle at the pick stations, where the chips are unconstrained by cover strips 19, reference being made to FIG. 2. The tendency toward shingling is created not only by the vibrational forces, but by the relatively low forces transmitted by those drive members 32 which are acting against the chips in fully-filled grooves 14.

The elements next described not only prevent shingling, but also assure that a chip will remain immediately adjacent stop 16 (FIG. 2), even when there is only one chip in the groove 14. It is to be understood that when there is only one chip at the pick station (and no chips adjacent such one chip), that chip tends to vibrate away from stop 16. This would degrade the accuracy of the point of connection of chuck 22 with such chip, and thus degrade the accuracy of placement of the chip on the circuit board.

In accordance with one aspect of the present invention, advantage is taken of the fact that the chips 17, shown in greatly enlarged form in FIG. 7, have nickel layers 41 (beneath the solder, as shown broken away) as part of the end conductor configurations. Such nickel layers are magnetizable to a certain extent. Furthermore, the chips are oriented, when in the magazines 21 and thus when in grooves 14, such that one of the ends 42–43 is forward and the other of such ends is rearward. The present magnet means create a downward force relative to the rear end of the chip located at the pick station (adjacent stop 16), and also create a forward force relative to such chip at the pick station. The downward force is caused to be insufficiently great to impede feeding of chips along the groove, but sufficiently great to prevent shingling even when the groove is full.

In accordance with another aspect of the present invention, the magnet means are in the form of a single magnetic circuit that creates both the desired amount of downward force at a region spaced from stop 16 by the length of a chip, and also creates the forwardly-directed force to maintain the chip against the stop even when there is only one chip in the groove (no chips between such one chip and the feeding mechanism).

Referring particularly to FIG. 2, the magnet means comprises a permanent magnet 44 that is sandwiched between forward and rear pole pieces 45 and 46. The pole pieces are steel bars that lie in vertical planes. The orientation of the magnet 44 is such that one pole thereof is adjacent each pole piece.

The pole pieces are secured together by means of fasteners 47 that extend through the magnet, and the whole assembly is fixedly secured to vibrating table 13. The stop 16 is a steel bar that is preferably stepped down at its rear edge, and this bar is secured to the upper edge of forward pole piece 45 by means of screws 48. Stop bar 16 is cantilevered rearwardly, overhanging the magnet.

The upper side of magnet 44 is spaced well below the bottom surface of stop bar 16, so that there is an air space 49. Furthermore, the upper-rear corner edge of rear pole piece 46 is beveled, to create a magnetic field-intensifying thin edge 51. Edge 51 is disposed immediately beneath the rear end of a chip 17 when the forward edge of such chip is engaged with the rear vertical stop surface 52 of stop bar 16.

Because of the presence of the air space 49 below the cantilevered stop bar 16, and because of the presence of edge 51, there is created a certain magnetic circuit as shown by dashed lines in FIG. 2. Such circuit extends rearwardly from magnet 44, thence upwardly through pole 46 to edge 51 of such pole, thence upwardly to the rear nickel sub-coating of the chip engaged with surface 52, thence forwardly through such chip located at the pick station, thence forwardly through the stop bar 16 (which forms part of the magnetic circuit), and thence downwardly through forward pole piece 45 to the other pole of magnet 44.

The magnetic flux in the described circuit pulls downwardly on the rear end of chip 17 at the pick station, and pulls forwardly at the forward end of such chip. As stated above, the strength of the magnet 44, and the construction of the pole pieces thereof, are such that the magnetic field will not impede the forward vibratory movement of chip 17 until surface 52 is engaged. Furthermore, the magnetic force is not sufficient to impede the operation of vacuum chuck 22 (or other pick means) in picking up the chip 17 and thereafter placing it on the circuit board.

It is pointed out that, in the described construction, the stop bar 16 performs the double function of being a part of the magnetic circuit. Such bar forms an extension of pole piece 45 and is, itself, a pole piece as well as a stop.

The foregoing detailed description is to be clearly understood as given by way of illustration and example only, the spirit and scope of this invention being limited solely by the appended claims.

What is claimed is:

1. In a pick-and-place machine that feeds chips in a row toward a pick station, said chips having magnetizable portions, a feeding and positioning apparatus for both positioning each chip at said station and preventing shingling of the chip at said station, said assembly comprising:
    (a) means to feed chips in a row to a pick station from which said chips may be removed to a point of use,
    (b) stop means formed of a magnetizable material at said pick station for stopping the forward chip thereat, and
    (c) means for establishing a magnetic circuit adjacent said pick station in one path through said stop means and through the magnetizable portions of said forward chip for magnetically holding said forward chip in abutment with said stop means, and in another path for magnetically holding down at least the rear of said forward chip to prevent shingling, said means for establishing a magnetic field including a permanent magnet disposed adjacent said pick station and having a first pole piece in the vicinity of the rear of said forward chip and a second pole piece in magnetic circuit relationship with said stop means, said magnet being spaced below said stop means so that there is an air space to aid in shaping the magnetic circuit.

2. The invention as claimed in claim 1, in which means (a) includes means to define a groove for said row of chips, in which means are provided to vibrate the walls of said groove to effect vibratory feeding of the chips therein toward said pick station.

3. The invention as claimed in claim 2, in which means are provided to load said groove from a magazine of chips, said loading means being substantially jam-proof, said loading means exerting, when said groove is full of chips, a low force directed toward said pick station.

4. In a pick-and-place machine that feeds chips in a row toward a pick station, said chips having magnetizable portions, a combination stop and magnetic assembly for both positioning each chip at said station and preventing shingling of the chip at said station, said assembly comprising:
    (a) stop means provided at said pick station for stopping the forward chip thereat, and
    (b) a permanent magnet disposed adjacent said pick station, a first pole piece extending from one pole piece of said magnet to the vicinity of the rear of the forward chip, and a second pole piece including stop means formed of a magnetizable material extending from the other pole of said magnet to a region in advance of said forward chip, said magnet being spaced below said stop means so that there is an air space to aid in shaping a magnetic circuit through the magnetizable portions of said forward chip to:
        1. magnetically hold down at least the rear of said forward chip to prevent shingling, and
        2. magnetically hold said forward chip in abutment with said stop means.

5. The invention as claimed in claim 4, in which said first pole piece has a relatively sharp edge which concentrates the magnetic field in said magnetic circuit at a region relatively closely adjacent the rear of said forward chip.

6. The invention as claimed in claim 4, and further comprising a vibratory support to effect feeding of chips in a row toward said pick station, and in which said stop means (a) is fixedly mounted on said support.

7. A substantially jam-proof, compact pick-and-place machine that does not require logic circuits, said machine comprising:
(a) a support means defining parallel grooves,
(b) means to effect vibration of said support means to feed chips along said grooves from the rear end of said support means to pick stations at the forward end thereof,
(c) means to effect at least sufficient covering of said grooves to prevent substantial upward movement of the chips therein, said means terminating adjacent said pick stations so that said pick stations are not covered,
(d) means to load said groove with chips,
(e) stop means provided at said pick station for stopping the forward chip thereat, and
(f) a permanent magnet disposed adjacent said pick station, a first pole piece extending from one pole of said magnet to the vicinity of the rear of the forward chip, and a second pole piece including stop means formed of a magnetizable material extending from the other pole of said magnet to a region in advance of said forward chip, said magnet being spaced below said stop means so that there is an air space to aid in shaping a magnetic circuit through the magnetizable portions of said forward chip to:
1. magnetically hold down at least the rear of said forward chip to prevent shingling, and
2. magnetically hold said forward chip in abutment with said stop means.

8. The invention as claimed in claim 7, in which said means to load said grooves with chips comprises a row of magazines extending upwardly from said rear end of said support means in registry with said grooves, each of said magazines having a stack of chips therein, and further comprises means to unload said magazines into said grooves in substantially jam-proof manner, said unloading means comprising drive members, each of said drive members having a first position at which a stack of chips in the associated magazine is supported by the drive member against downward movement caused by gravity, each of said drive members having a second position not beneath the stack of chips in the associated magazine, but instead rearwardly adjacent a rearward chip which has dropped out of said magazine as a result of movement of said drive member, and in which means are provided to bias said drive members forwardly from said second position to said first position with a predetermined low force which is insufficient to effect jamming of the drive mechanism and is insufficient to cause shingling of the magnetically-influenced chips at the associated feed station.

* * * * *